(12) United States Patent
Ishii et al.

(10) Patent No.: US 6,311,638 B1
(45) Date of Patent: Nov. 6, 2001

(54) PLASMA PROCESSING METHOD AND APPARATUS

(75) Inventors: Nobuo Ishii, Minoo; Yasuyoshi Yasaka, Uji; Makoto Ando, Kawasaki; Naohisa Goto, Tokyo-to, all of (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/500,520

(22) Filed: Feb. 9, 2000

(30) Foreign Application Priority Data

Feb. 10, 1999 (JP) .................................. 11-033066
Nov. 17, 1999 (JP) .................................. 11-326991

(51) Int. Cl.$^7$ .............................. C23C 16/00; H05H 1/00
(52) U.S. Cl. ........................... 118/723 MW; 118/723 E; 118/723 I; 156/345
(58) Field of Search .................. 156/345; 118/723 MW, 118/723 ME, 723 AN, 723 E

(56) References Cited

U.S. PATENT DOCUMENTS 5,458,732 * 10/1995 Butler et al. ............................ 216/61
5,472,561 * 12/1995 Williams et al. .................. 156/627.1
5,688,357 * 11/1997 Hanawa ................................ 156/345
5,698,036 * 12/1997 Ishii et al. ..................... 118/723 MW
5,702,562 * 12/1997 Wakahara ......................... 156/626.1

FOREIGN PATENT DOCUMENTS 09-063793    3/1997 (JP) .

* cited by examiner

Primary Examiner—Gregory Mills
Assistant Examiner—P. Hassanzadeh
(74) Attorney, Agent, or Firm—Finnegan, Henderson, Farabow, Garrett & Dunner L.L.P.

(57) ABSTRACT

A plasma processing apparatus has a vacuum vessel, a high-frequency power generator that generates a high-frequency wave, a waveguide for propagating the high-frequency wave generated by the high-frequency power generator into the vacuum vessel to produce a plasma by ionizing a processing gas supplied into the vacuum vessel and to process a semiconductor wafer supported on a support table in the vacuum vessel. A reflection coefficient measuring unit 5 is combined with a waveguide 35 to take data on a ratio $\Gamma_0$ of advancing wave from the high-frequency power generator 4 and reflected wave from the plasma and phase θ of reflection coefficient. Factors dominating the electron density of the plasma including the output power of the microwave power generator are controlled on the basis of the measured data, whereby the electron density is controlled and stable processing is ensured.

16 Claims, 9 Drawing Sheets

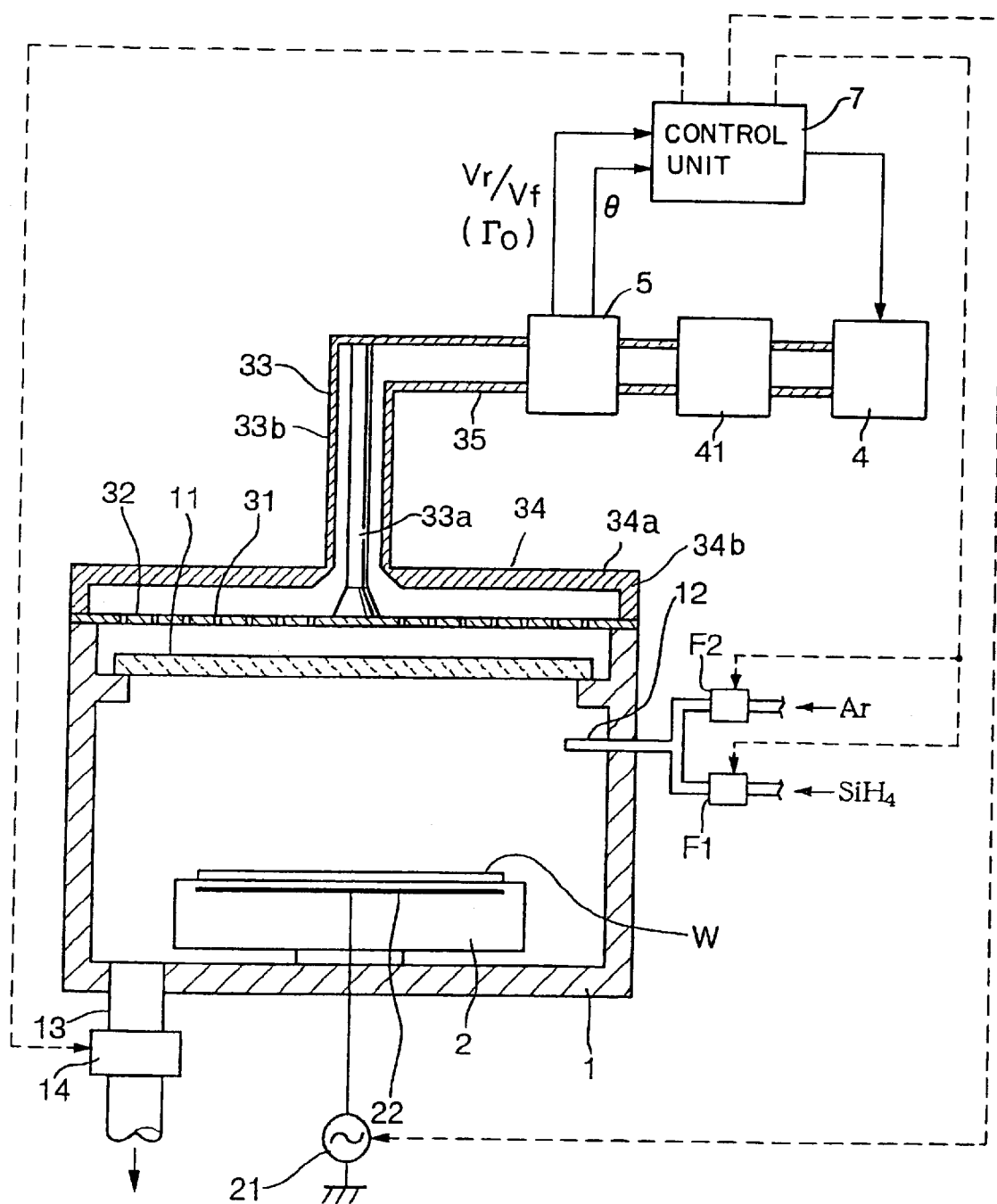
F I G. 1

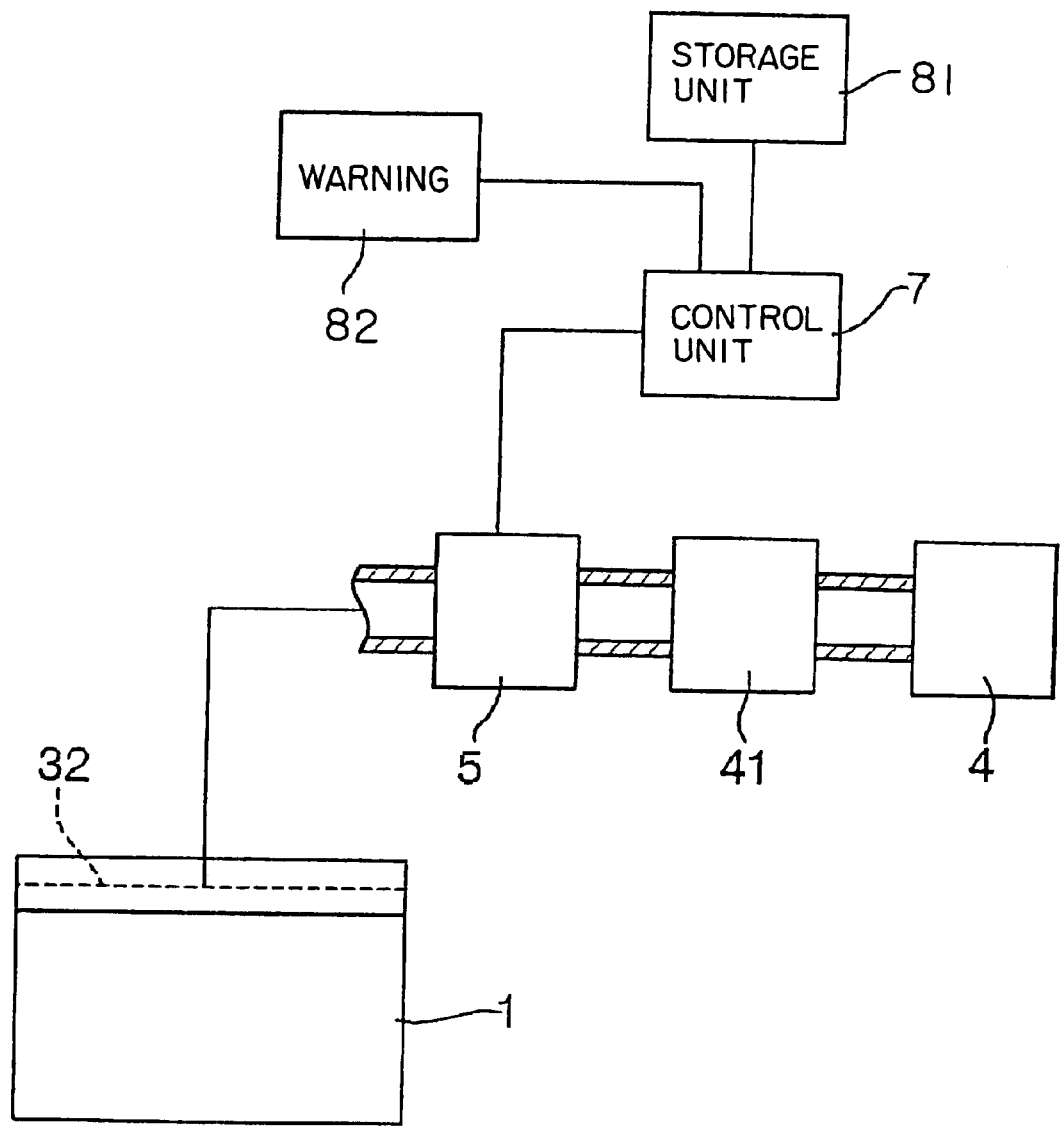
F I G. 6

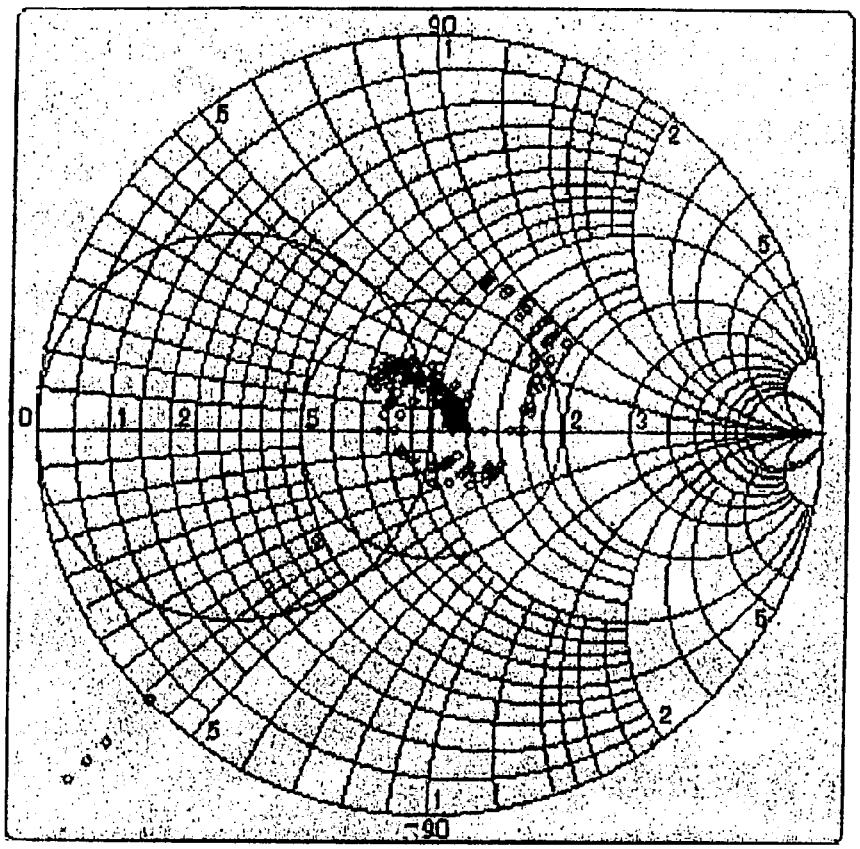
F I G. 7
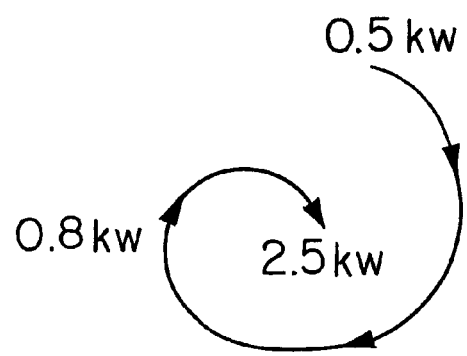
F I G. 8

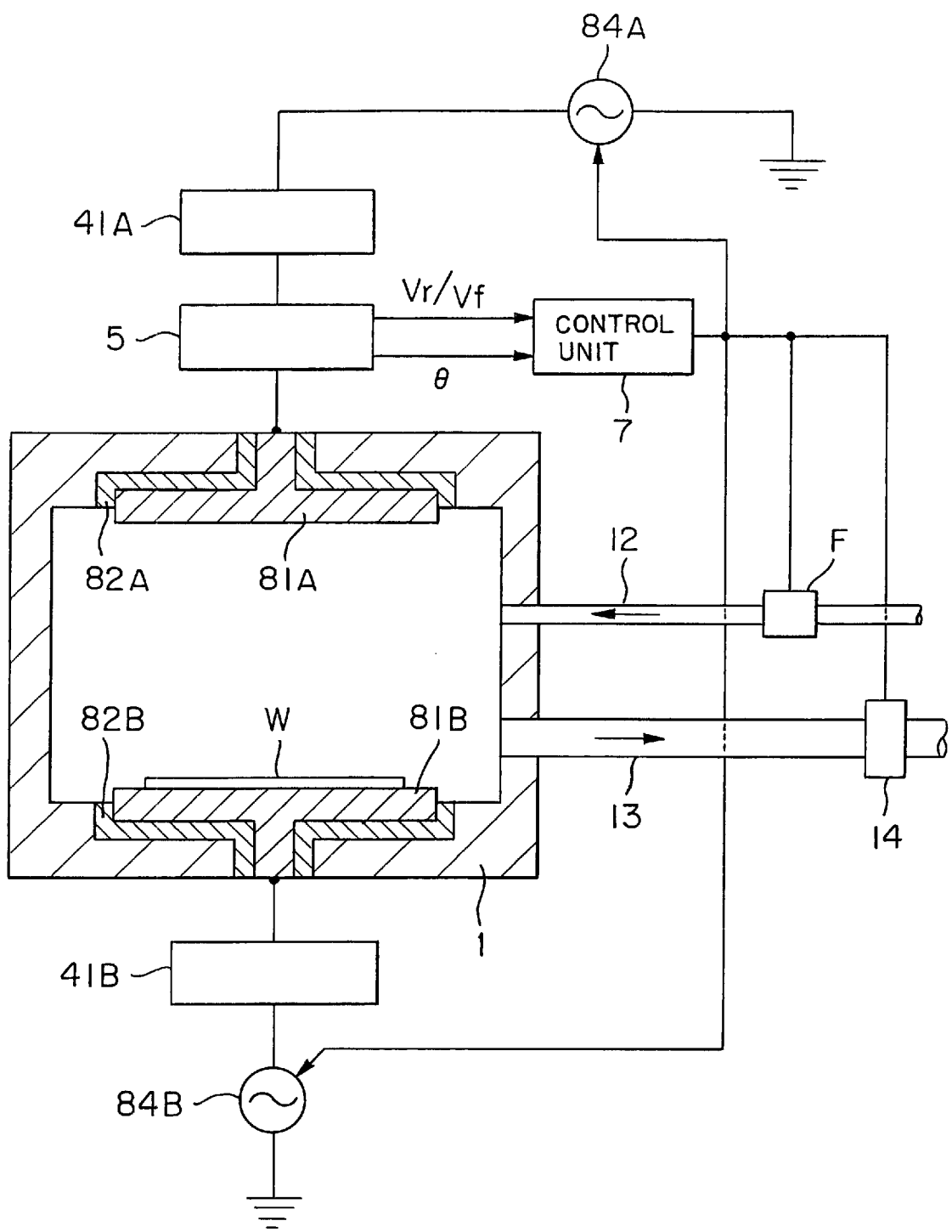
F I G. 11

PLASMA PROCESSING METHOD AND APPARATUS

BACKGROUND OF THE INVENTION

1. Field of the Invention

The present invention relates to a plasma processing method and apparatus that produces a plasma by the energy of a high-frequency wave, such as a microwave, etc. and processes a workpiece, such as a semiconductor wafer, with the plasma.

2. Description of the Related Art

Semiconductor device fabricating processes include a plasma processing process that processed semiconductor wafers (hereinafter referred to simply as "wafers") with a plasma. FIG. 12 shows a known microwave plasma processing system for carrying out such a plasma processing process. This known microwave plasma processing system has a vacuum vessel 9, a work support table 91 placed in the vacuum vessel 9 to support a wafer W thereon, and a plane slot antenna 92 disposed in an upper region of the interior of the vacuum vessel 9. Microwaves radiated by a microwave power generator 93 is fed through a waveguide 94 to the antenna 92, the microwaves are fed from the antenna 92 to produce a plasma by ionizing a processing gas supplied from a gas supply pipe 95, and a film is deposited on the surface of the wafer W or the surface of the wafer W is etched with the plasma. In FIG. 12, indicated at 96 is a quartz window.

A load matching device 97 is placed on the waveguide 94 to make conjugate the impedance of a section of the waveguide 94 between the load matching device 97 and the plasma and the impedance of a section of the same between the load matching device 97 and the microwave power generator 93 to suppress reflection of the microwave from the plasma.

The electron density of the plasma is one of factors dominating the condition of the process for processing the wafer W. When a gas that does not produce negative ions is used, electron density is substantially equal to plasma density. When a gas that produces negative ions is used, negative ion density increases as electron density decreases. Therefore, it is desirable for stable processing to keep electron density constant during the process. However, it is difficult to know electron density and hence it is not easy to control electron density.

The condition of a plasma is dependent on the microwave power and pressure in the vacuum vessel 9. Therefore, microwave utilization factor in using a microwave for producing a plasma decreases even if the impedances are matched by the load matching device 97 because some condition of the plasma increases the amount of the microwave reflected by the plasma toward the microwave power generator 93 and the reflected microwave generates heat due to dielectric loss or ohmic loss.

The present invention has been made in view of such problems and it is therefore an object of the present invention to enable monitoring the electron density of a plasma by measuring the reflection coefficient of high-frequency waves, such as microwaves or RF waves, radiated by a power generator.

SUMMARY OF THE INVENTION

According to an aspect of the present invention, the above object is attained by a plasma processing method comprising the steps of: placing an object to be subjected to a processing into a vacuum vessel; supplying a processing gas into the vacuum vessel; supplying a high-frequency wave into the vacuum vessel from a high-frequency power generator; subjecting the object to the processing by generating a plasma of the processing gas in the vacuum vessel by the high-frequency wave; measuring a state of a reflected high-frequency wave reflected at the plasma, relative to an advancing high-frequency wave travelling toward the plasma; and controlling an electron density of the plasma in response to a measured state of the reflected high-frequency wave.

According to another aspect of the present invention, the above object is attained by a plasma processing apparatus comprising: a vacuum vessel; a device for supplying a processing gas into the vacuum vessel; a high-frequency power generator for supplying a high-frequency wave into the vacuum vessel to produce plasma of the processing gas; a measuring unit for measuring state of a reflected high-frequency wave reflected at the plasma, relative to an advancing high-frequency wave travelling from the high-frequency power generator toward the plasma; and a control unit for controlling an electron density of the plasma in response to the state of the reflected high-frequency wave measured by the measuring unit.

The above and other object, features and advantages of the present invention will become more apparent from the following description taken in connection with the accompanying drawings.

BRIEF DESCRIPTION OF THE DRAWINGS

FIG. 1 is a schematic vertical sectional view of a plasma processing apparatus in a first embodiment of the present invention;

FIG. 6 is a schematic view of a plasma processing apparatus in a further embodiment of the present invention;

FIG. 7 is a Smith chart showing the characteristics of an antenna employed in a plasma processing apparatus in accordance with the present invention;

FIG. 8 is an explanatory view of a Smith chart;

FIG. 11 is a schematic vertical sectional view of a plasma processing apparatus in a still further embodiment of the present invention.

DESCRIPTION OF THE PREFERRED EMBODIMENTS

Figure 2:
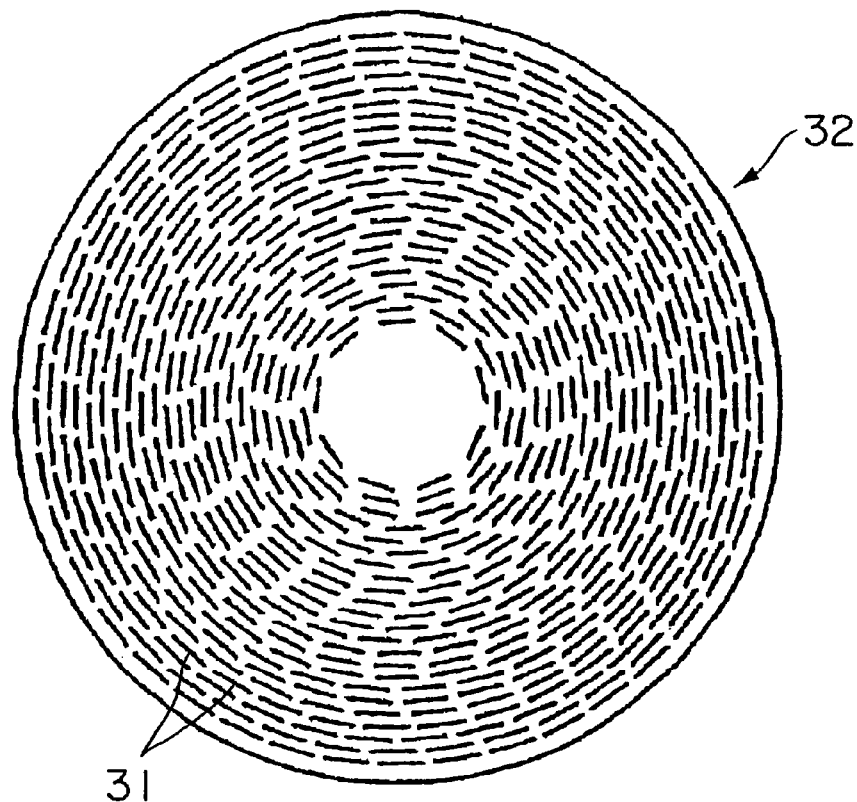
FIG. 2 is a plan view of an antenna included in the plasma processing apparatus shown in FIG. 1.

Referring to FIG. 1 showing a plasma processing apparatus in an embodiment of the present invention, a wafer table 2 for supporting a wafer W therein is disposed in a lower region of the interior of a vacuum vessel 1, and a bias electrode 22 is embedded in the wafer table 2 and is connected to a 13.56 MHz high-frequency power generator 21. The vacuum vessel 1 is provided with a temperature regulating unit, not shown. A window 11 of a dielectric material, such as quartz, is disposed in the upper region of the interior of the vacuum vessel 1. A plane slot antenna 32 provided with a plurality of slots 31 as shown in FIG. 2 is disposed above and opposite to the window 11.

One end of a shaft 33a of a waveguide 33 coaxial with the plane slot antenna 32 is connected to the central portion of the plane slot antenna 32. A flat cylindrical part 34 having a, horizontal, annular end wall 34a and a side wall 34b extending perpendicularly to the end wall is formed on the lower end of an outer tube 33b of the waveguide 33. One end of a rectangular waveguide 35 is joined to an upper end portion of a side wall of the outer tube 33b. A microwave power generator 4 is connected to the other end of the rectangular waveguide 35.

A load matching unit 41 and a reflection coefficient measuring unit 5 are arranged in this order below the microwave power generator 4 on the waveguide 35. The load matching unit 41 operates to match the impedance of a section of the waveguide 35 on the side of a plasma with the impedance of a section of the same on the side of the microwave power generator 4. The reflection coefficient measuring unit 5 will be described later in detail.

A processing gas supply pipe 12 is connected to, for example, a side wall of the vacuum vessel 1. For example, silane ($SiH_4$) gas, i.e., a film forming gas, and argon (Ar) gas, i.e., a carrier gas, are mixed and supplied through the processing gas supply pipe 12 into the vacuum vessel 1. The respective flow rates of $SiH_4$ gas and argon Ar gas are regulated by a mass-flow regulators F1 and F2, respectively. A shower head made of a dielectric material, such as quartz, disposed below the window 11 may be used for supplying the processing gas instead of the processing gas supply pipe 12. A discharge pipe 13 is connected to the bottom wall of the vacuum vessel 1 and is connected to an evacuating device, not shown, by a pipe provided with a pressure regulator 14 to evacuate the vacuum vessel 1. The pressure in the vacuum vessel 1 is regulated by regulating the opening of a butterfly valve by the pressure regulator 14.

Figure 3:
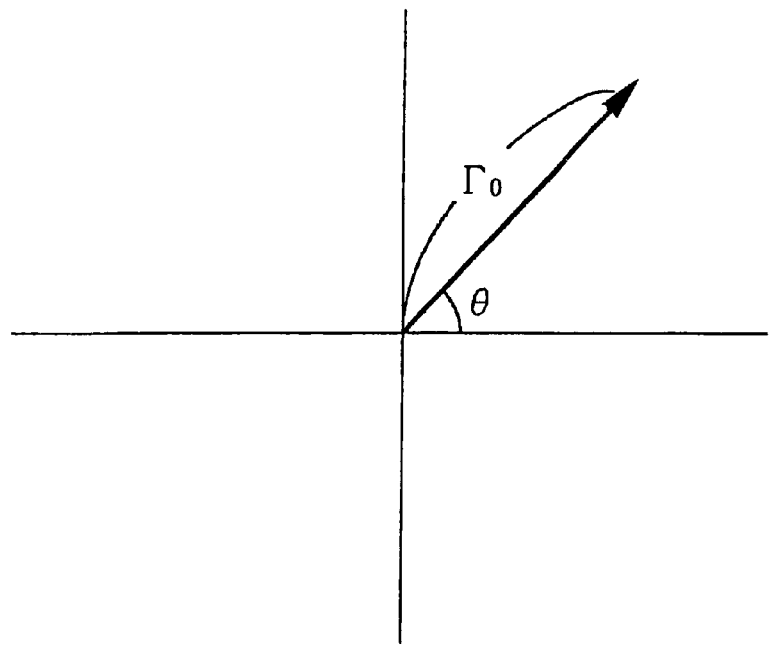
FIG. 3 is a diagram for in explaining a conception of reflection coefficient.

The reflection coefficient measuring device 5 measures voltage reflection coefficient. The reflection coefficient is an index of the ratio of reflected electromagnetic waves reflected by a plasma and traveling back toward the microwave power generator 4 to advancing electromagnetic waves traveling from the microwave power generator 4 to the plasma. Reflection coefficient Γ is expressed by Expression (1).

$$\Gamma = \Gamma_0 \cdot e^{j\theta} \tag{1}$$

where $\Gamma_0$ is the absolute value of reflection coefficient, θ is the phase of reflection coefficient, and j is imaginary number unit. FIG. 3 shows a reflection coefficient in a vector. The absolute value $\Gamma_0$ of the reflection coefficient Γ can be expressed by: $\Gamma_0 = V_r/V_f$, where $V_r$ is the absolute value of the amplitude of the advancing wave and $V_f$ is the absolute value of the amplitude of the reflected wave.

Figure 4:
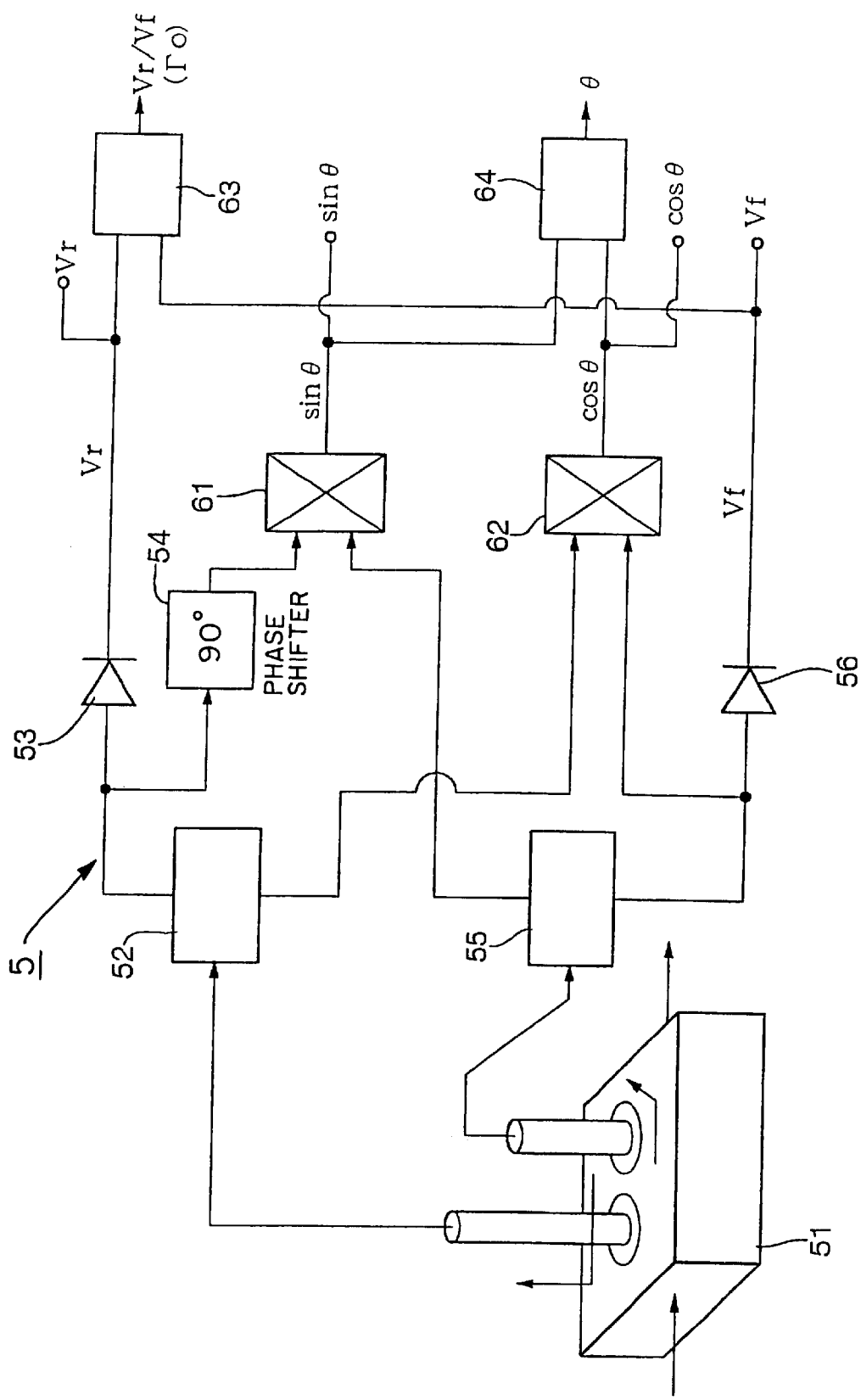
FIG. 4 is a block diagram of a reflection coefficient measuring unit.

Referring to FIG. 4, the reflection coefficient measuring unit 5 has a directional coupler 51 placed in the waveguide 35 to provide power signals representing the magnitudes of power of the reflected wave and the advancing wave. The power signal representing the power of the reflected wave is distributed by a distributor 52 in signals. One of the signals distributed by the distributor 52 is transferred to a wave detector 53 and a phase shifter 54. The phase shifter 54 changes the phase of the power signal by 90° and gives the power signal to a mixer 61. The other signal distributed by the distributor 52 is given to a mixer 62. The power signal representing the power of the advancing wave is distributed by a distributor 55 in signals. One of the signals distributed by the distributor 55 is transferred to a wave detector 56 and the mixer 62. The other signal distributed by the distributor 55 is sent to the mixer 61.

The detector 53 provides the amplitude $V_r$ of the reflected wave and the detector 56 provides the amplitude $V_f$ of the advancing wave. An arithmetic unit 63 receives the amplitudes $V_r$ and $V_f$, and calculates $V_r/V_f = \Gamma_0$. The mixers 61 and 62 provide sinθ and cosθ, respectively, where θ is the phase of the reflection coefficient, and an arithmetic unit 64 receives sinθ and cosθ and calculates the phase θ.

The arithmetic units 63 and 64 give calculated values of $\Gamma_0$ ($V_r/V_f$) and θ to a control unit 7 shown in FIG. 1. The control unit 7 controls the output power of the microwave power generator 4 according to the calculated values given thereto. Control procedure to be carried out by the control unit 7 will be described later. Since the load matching unit 41 is liable to disturb the microwave, it is preferable to dispose the reflection coefficient measuring unit 5 downstream from the load matching unit 41 with respect to the direction of propagation of the microwave from the microwave power generator 4.

A process of forming a polysilicon film on a wafer by the plasma processing apparatus will be described hereafter. A gate valve, not shown, is opened and a wafer W is placed on the wafer table 2 by a transfer arm, not shown. The gate valve is closed, the vacuum vessel 1 is evacuated to a predetermined vacuum of, for example, $10^{-6}$ torr. Subsequently, a film forming gas, such as $SiH_4$, and a carrier gas, such as Ar, are supplied into the vacuum vessel 1. Then, for example, a 2.45 GHz microwave of 2.5 kW is generated by the microwave generator 4, and the high-frequency power generator 21 supplies, for example, 13.56 MHz bias power of 1.5 kW to the wafer table 2.

The microwave generated by the microwave generator 4 propagates through the waveguides 35 and 33 into the flat cylindrical part 34 and propagates through the slots 31 of the antenna 32 into the vacuum vessel 1 to ionize the processing gas supplied into the vacuum vessel 1. Activated radicals and irons produced by ionizing $SiH_4$ are deposited on a surface of the wafer W in a polysilicon film.

Meanwhile, the reflection coefficient measuring unit 5 measures the absolute value $\Gamma_0$ of the reflection coefficient and the phase θ and gives the same to the control unit 7. The antenna 32 is designed so that the reflection of the microwave is reduced when the electron density of the plasma is suitable for the film forming process. When the electron density of the plasma is not equal to a desired value, the reflection of the microwave increases. If the electron density is not equal to the desired value, the amplitude $\Gamma_0$ of the reflection coefficient increases. Although the variation of the electron density can be detected through monitoring of the absolute value $\Gamma_0$, it is impossible to find whether the electron density is increasing or whether the same is decreasing.

Therefore, the plasma processing apparatus monitors also the phase θ of the reflection coefficient to find the directions of change of the electron density. When the electron density of the plasma becomes greater than a pre-assumed electron density, electric current can easily flow so that the electric resistance component of the plasma becomes smaller than a pre-assumed value and the phase θ of the reflected wave changes relative to the advancing wave. Consequently, the value $\Gamma_0$ of the reflection coefficient increases and the phase $\theta$ decreases. The control unit 7 compares the present amounts of the value $\Gamma_m$ and the phase $\theta_m$ with the amounts of the value $\Gamma_s$ and the phase $\theta_s$ either at a time point when the reflection coefficient is stabilized (when the range of variation becomes narrow) for the first time after the production of plasma or at a time point a predetermined time (1 to 5 seconds) after the production of plasma, and the control unit 7 operates to reduce the output of the microwave power generator 4 according to the result of the comparison (differences). When the power of the microwave is thus reduced, the electron density decreases, the value $\Gamma_m$ decreases and the lead of the phase $\theta_m$ decreases.

When the electron density of the plasma becomes smaller than a pre-assumed electron density, it becomes difficult for the electric current to flow through the plasma, and therefore the resistance of the plasma becomes greater than a pre-assumed value. Consequently, the value $\Gamma_0$ of the reflection coefficient increases and the phase $\theta$ also increases. The control unit 7 controls the microwave power generator 4 so that the output of the microwave power generator 4 increases according to changes in the value $\Gamma_0$ and the phase $\theta$. When the power of the microwave is thus increased, the electron density increases, the value $\Gamma_0$ decreases and the delay of the phase $\theta$ becomes small.

Thus, a change in the electron density of the plasma and the direction of change, i.e., increase or decrease, can be known through the measurement of the value $\Gamma_0$ and the phase $\theta$ of the reflection coefficient, and the output of the microwave power generator 4 is controlled according to the measured result. Thus, the electron density of the plasma is maintained at an appropriate value and a stable film forming process can be achieved. Since the reflected wave is small, power loss is suppressed and an efficient plasma processing can be achieved.

Means for regulating the electron density of the plasma need not be limited to the control of the output of the microwave power generator 4 on the basis of the measured reflection coefficient; the electron density of the plasma may be regulated by controlling any factor that affects the electron density of the plasma. For example, as shown in FIG. 1, the pressure in the vacuum vessel 1 may be controlled by the pressure regulator 14; the $SiH_4/Ar$ flow rate ratio may be controlled by adjusting the flow rate of $SiH_4$ by means of the mass-flow regulator F1, by adjusting the flow rate of Ar by means of the mass-flow regulator F2 or by adjusting the respective flow rates of $SiH_4$ and Ar by means of the mass-flow regulators F1 and F2; or the bias power may be controlled by the high-frequency power generator 21. Those control operations may be used in combination or the control of microwave power may be used in combination with those control operations.

If the value $\Gamma_0$ increases while the phase $\theta$ decreases (the reflected wave leads the advancing wave), this means that the electron density is increasing. Therefore, the foregoing control operations are performed so as to reduce the pressure in the vacuum vessel 1, to reduce the $SiH_4/Ar$ flow rate ratio and to reduce the bias high-frequency power.

Figure 5:
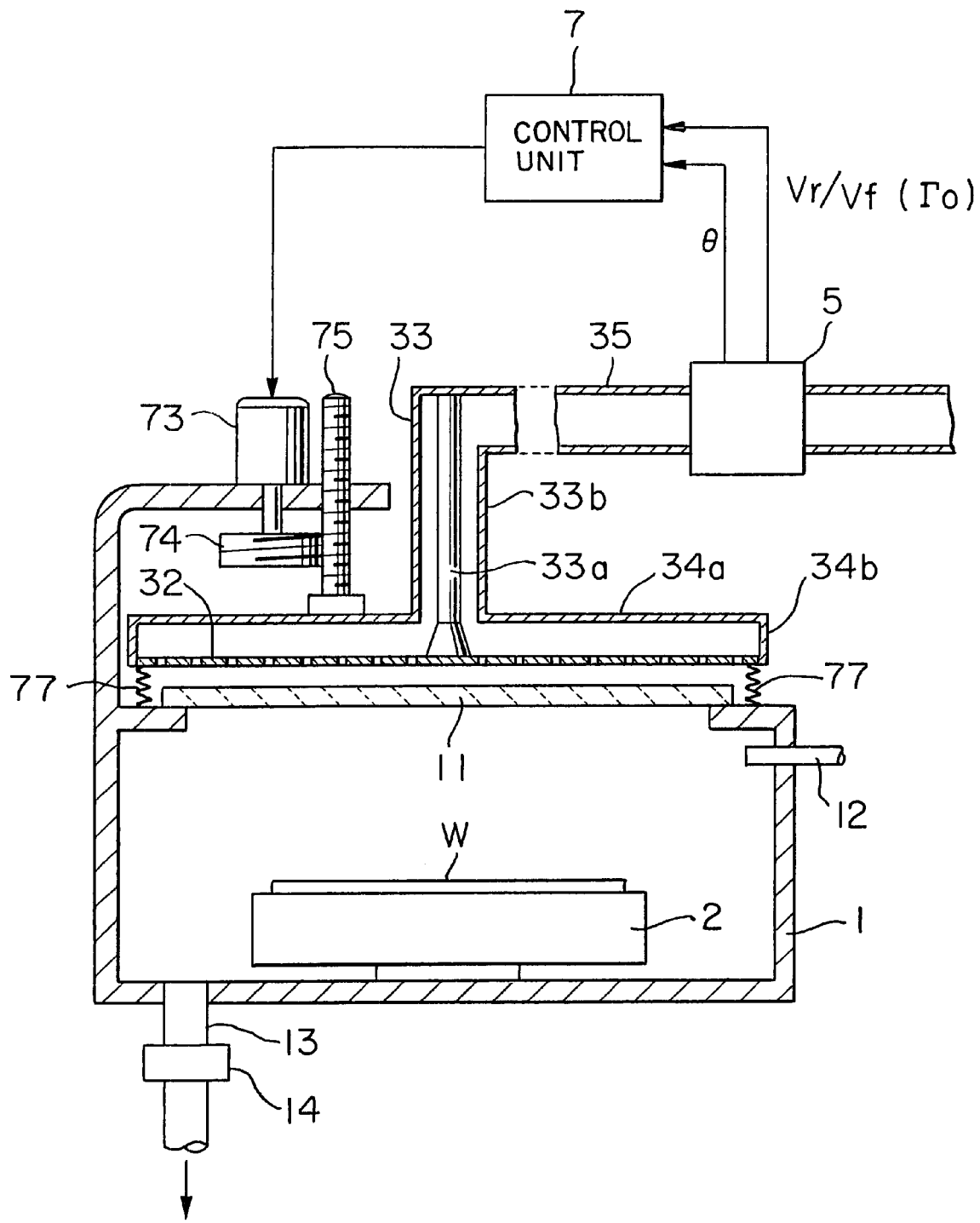
FIG. 5 is a schematic vertical sectional view of a plasma processing apparatus in another embodiment of the present invention.

In the embodiment of the invention shown in FIG. 5, the distance of the antenna 32, i.e., a high-frequency wave radiating unit, fixed to the cylindrical part 34b relative to the space in the vacuum vessel 1 is controlled on the basis of the measured reflection coefficient. As shown, the cylindrical part 34b is moved vertically by a position control motor 73 fixed to the vacuum vessel 1. The motor 73 rotates a gear 74 in response to signals from the control unit 7. The gear 74 then rotates a screw rod 75 in mesh with the gear 74. The screw rod 75 is fixed to the upper surface of the end wall 34a and causes the antenna 32 to move vertically as a result of rotation of the screw rod 75, whereby the height of the antenna 32 can be adjusted. Numeral 77 indicates a shielding member such as a metal bellows, for preventing the leakage of the microwave. The shielding member 77 connects the side wall 34b and the vacuum vessel 1. Generally, the intensity of an electric field created by an antenna decreases with distance from the antenna. Therefore, the position control motor 73 raises the antenna 32 when the electron density is excessively high.

Although the foregoing control operation is carried out on the basis of changes in the amounts of the value $\Gamma_0$ and the phase $\theta$ at a certain time point, the foregoing operation may be carried out on the basis of the result of comparison, i.e., differences, between measured values and predetermined desired values.

The application of the plasma processing process is not limited to the formation of a polysilicon film, but the plasma processing process may be applied to a processing using a processing gas containing fluorine, such as $C_4F_8$ gas, to form a carbon film containing fluorine and to an etching process using $CF_4$ gas. In such a plasma processing process, radicals are sputtered from a thin film deposited on the inner surfaces of the vacuum vessel 1, and electrons and the radicals combine together to produce negative ions. Consequently, the electron density decreases. In such a case, the microwave power generator 4 or a proper factor is controlled to adjust the electron density to an appropriate value.

According to the present invention, process conditions for processing the succeeding wafer may be controlled by taking time-series data on the value $\Gamma_0$ and the phase $\theta$ during the processing of the preceding wafer or a test wafer, storing the time-series data in a storage unit 81 shown FIG. 6, analyzing the stored time-series data and using the results of analysis of the time-series data instead of carrying out the control operation on the basis of data measured by the reflection coefficient measuring unit 5. For example, when the operator decides, on the basis of the data on the value $\Gamma_0$ and the phase $\theta$, that the electron density of the plasma is higher than the desired electron density, the output of the microwave power generator 4 may be reduced or the control unit 7 may automatically execute the adjustment of the output of the microwave power generator 4, for example, before the start of processing wafers of a new lot.

The condition of the plasma processing apparatus can be known from the data stored in the storage unit 81. For example, abnormal discharge from substances deposited on the inner surface of the vacuum vessel 1, the thermal deformation of the antenna and an abnormal change in the microwave due to troubles in the electric circuit can be known from a change in the electron density.

The control unit 7 may monitor the measured data provided by the reflection coefficient measuring unit 5 and may decide that an abnormal condition occurred in the plasma processing apparatus when changes in the value $\Gamma_0$ and the phase $\theta$ from the value $\Gamma_s$ and the phase $\theta_s$ measured at a certain time point and stored in the storage unit 81 have exceeded predetermined levels, respectively, and the control unit 7 may provide warning directions at the warning unit 82.

Figure 9:
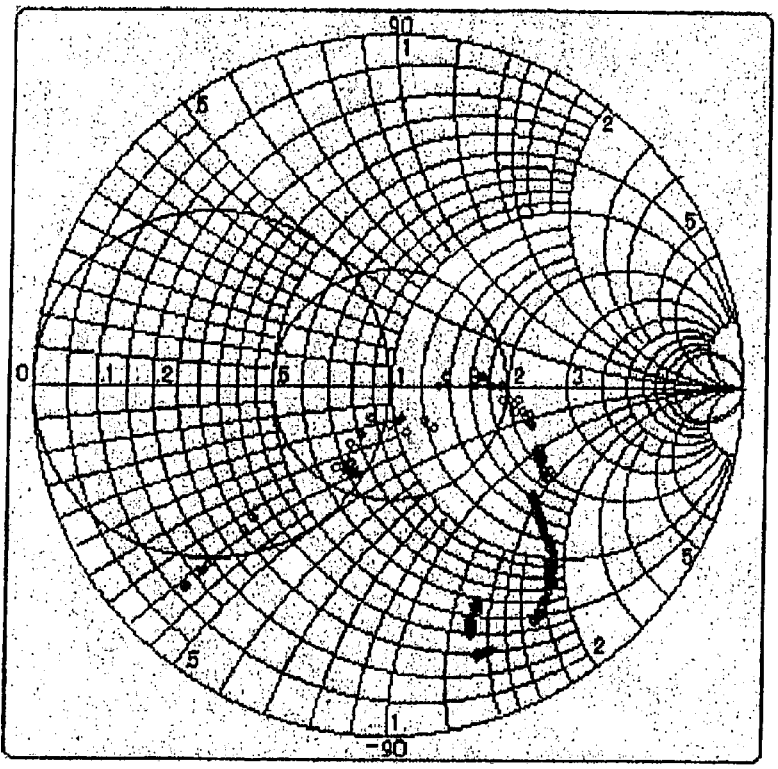
FIG. 9 is a Smith chart showing the characteristics of another antenna.
Figure 10:
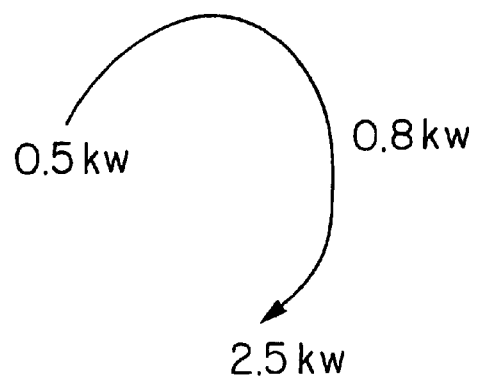
FIG. 10 is a view explanatory of the Smith chart shown in FIG. 9.
Figure 12:
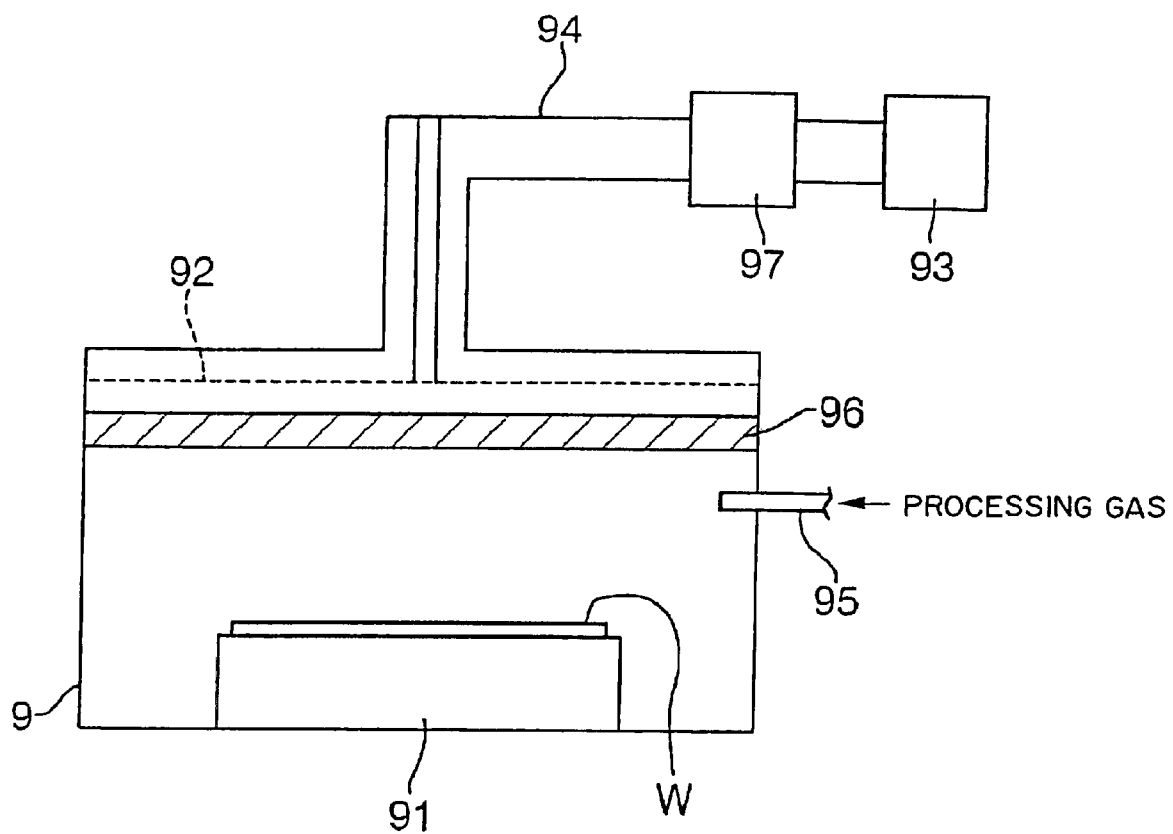
FIG. 12 is a schematic sectional view of a prior art plasma processing apparatus.

The measured data provided by the reflection coefficient measuring unit 5 can be used as guidelines for designing the antenna. FIG. 7 is a Smith chart of reflection coefficient when the microwave power supplied to the antenna 32 shown in FIG. 2 is increased from 0.5 kW toward 2.5 kW. In this Smith chart, the resistance component of an impedance of a section downstream of the reflection coefficient measuring unit 5 is measured on the horizontal axis. A symbol p used in an expression: $\Gamma_0=(\rho-1)/(\rho+1)$ represents voltage standing wave ratio and is equal to the value of $\rho$ in a region corresponding to graduations not smaller than one on the horizontal axis. Curves extending from the right-hand end on the upper and the lower side of the horizontal axis shows same reactance components of impedances. In FIG. 7, $\Gamma_0$, is the distance from the center, and $\theta$ is the angle from the horizontal axis. As obvious from FIG. 7, the reflection coefficient varies along a coiling locus coiling in a clockwise direction around a point where $\rho=1$, i.e., $\Gamma_0=0$, as the output power of the microwave power generator 4, i.e., the power of the microwave, is increased, which proves that the antenna is well matched. In another antenna, the reflection coefficient varies along a circular locus that approaches the horizontal axis from below and then recedes from the horizontal axis as shown in FIGS. 9 and 10, which proves that the antenna is not matched.

An RF power generator or a UHF power generator may be used instead of the microwave power generator to produce a plasma by ionizing a processing gas. In this specification, the microwave power generator, the RF power generator and the UHF power generator are designated inclusively as high-frequency power generators. Plasma can also be produced by ionizing the processing gas by means of electron cyclotron resonance caused by a microwave and a magnetic field.

An embodiment in which an RF power generator is used will be described with reference to FIG. 11. In this figure, parts and elements equivalent to the parts and elements shown in FIG. 1 are designated by the same reference numerals as used in FIG. 1. The vacuum vessel 1 is provided with a processing gas supply pipe 12 having a mass-flow regulator F, and a discharge pipe 13 having a pressure regulator 14. At an upper portion of the vacuum vessel 1, there is provided a first electrode 81A supported on the wall of the vacuum vessel 1 through a dielectric member 82A. Similarly, at a lower portion of the vacuum vessel 1, there is provided a second electrode 81B supported on the wall of the vacuum vessel through a dielectric member 82B. A wafer W to be subjected to the processing is adapted to be put on the second electrode 81B. A reflection coefficient measuring unit 5 is connected to the first electrode 81A, and a control unit 7 is connected to the measuring unit 5. To the reflection coefficient measuring unit 5 is connected a first load matching unit 41A which is connected to a first RF power generator 84A. Furthermore, to the second electrode 81B is connected a second load matching unit 41B which is connected to a second RF power generator 84B. Output from the control unit 7 is supplied to at least one of the mass-flow regulator F of the processing gas supply pipe 12, the pressure regulator 14 of the discharge pipe 13, and the pair of the first and second RF power generators 84A and 84B.

In this embodiment, RF wave is produced in the vacuum vessel 1 by the operation of the RF power generators 84A and 84B connected to the electrodes 81A and 81B, respectively, so that a plasma of the processing gas is generated in the vacuum vessel 1 to thereby carry out a plasma-processing of the workpiece. The reflection coefficient measuring unit 5 measures the advancing and reflected waves of the RF wave and outputs the amounts of the value $\Gamma_0$ and the phase $\theta$ of the reflection coefficient to send the same to the control unit 7. Thus, the control unit 7 operates to control a factor influencing the plasma density so as to enable an efficient plasma-processing, in the same manner as in the foregoing embodiments.

In the embodiment of the invention described above, the reflection coefficient measuring unit 5 is provided in only the upper RF power generating system, but a reflection coefficient measuring unit and a control unit may be provided between the electrode 81B and the load matching unit 41B.

As described above, the present invention carries out a plasma-processing of workpieces, by measuring the state of reflection of a high frequency wave due to a plasma produced in the vacuum vessel and by controlling the electron density in the plasma-processing vacuum vessel to a suitable value in response to the detected state of reflection. Therefore, a stable processing is ensured, electric energy loss can be suppressed by reducing the reflection of high-frequency wave, and an efficient plasma-processing is realized.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

What is claimed is:

1. A plasma processing apparatus comprising:
   a vacuum vessel;
   a device that supplies a processing gas into the vacuum vessel;
   a high-frequency power generator that supplies a high-frequency wave into the vacuum vessel to produce a plasma of the processing gas;
   a measuring unit that measures a state of a reflected high-frequency wave reflected at the plasma, relative to an advancing high-frequency wave traveling from the high-frequency power generator toward the plasma;
   a control unit that controls a electron density of the plasma in response to the state of the reflected high-frequency wave measured by the measuring unit; and
   said measuring unit being a device measures a reflection coefficient in absolute value which is a ratio of the absolute value of an amplitude of the reflected high-frequency wave to the absolute value of an amplitude of the advancing high-frequency wave, and a phase of the reflection coefficient.

2. The plasma processing apparatus according to claim 1, wherein:
   said high-frequency power generator is a microwave generator.

3. The plasma processing apparatus according to claim 2, further comprising:
   a waveguide for conducting a microwave generated by the microwave generator to the vacuum vessel; and
   a microwave propagating member provided in the vacuum vessel.

4. The plasma processing apparatus according to claim 2, wherein:
   said microwave propagating member is a plane slot antenna, and a shaft extends into the waveguide in coaxial disposition with the waveguide.

5. The plasma processing apparatus according to claim 1, wherein:
   said high-frequency power generator is an RF wave generator.

6. The plasma processing apparatus according to claim 1, wherein:
   said high-frequency power generator is a UHF power generator.

7. The plasma processing apparatus according to claim 1, wherein:
said control unit for controlling electron density of the plasma includes a device for controlling an output of the high-frequency power generator.

8. The plasma processing apparatus according to claim 1, wherein:
said control unit for controlling an electron density of the plasma includes a device for adjusting a pressure within said vacuum vessel.

9. The plasma processing apparatus according to claim 1, wherein:
said control unit for controlling an electron density of the plasma includes a device for adjusting a flow rate of the processing gas.

10. The plasma processing apparatus according to claim 1, wherein:
said control unit for controlling an electron density of the plasma includes a device for adjusting a high-frequency bias output power impressed to a table for mounting said object thereon.

11. The plasma processing apparatus according to claim 1, wherein:
said control unit for controlling an electron density of the plasma includes a high-frequency wave propagating member provided in the vacuum vessel; and
a mechanism for adjusting a position of the high-frequency wave propagating member.

12. The plasma processing apparatus according to claim 1, further comprising:
means for storing said reflection coefficient in absolute value and the phase of the reflection coefficient.

13. The plasma processing apparatus according to claim 1, further comprising:
a device for judging whether there is an abnormality in the plasma processing on the basis of the reflection coefficient in absolute value and the phase of the reflection coefficient; and
means for producing an alarm when said judging device judges that there is an abnormality.

14. A plasma processing apparatus comprising:
a vacuum vessel;
a waveguide connected to said vacuum vessel;
a device that supplies a processing gas into the vacuum vessel;
a high-frequency power generator that supplies a high-frequency wave through said waveguide into the vacuum vessel to produce a plasma of the processing gas within said vacuum vessel;
a measuring unit provided in said waveguide to measure a state of a reflected high-frequency wave within said waveguide, reflected at the plasma, relative to an advancing high-frequency wave traveling from the high-frequency power generator through said waveguide toward the plasma;
a control unit that controls an electron density of the plasma in response to the state of the reflected high-frequency wave measured by the measuring unit; and
said measuring unit being a device that measures a reflection coefficient in absolute value which is a ratio of the absolute value of an amplitude of the reflected high-frequency wave to the absolute value of an amplitude of the advancing high-frequency wave, and a phase of the reflection coefficient.

15. The plasma processing apparatus according to claim 14, wherein said high-frequency power generator is a microwave generator.

16. The plasma processing apparatus according to claim 15, further comprising a microwave propagating member provided in said vacuum vessel.

* * * * *